US012340972B2

(12) United States Patent
Ross-Messemer et al.

(10) Patent No.: US 12,340,972 B2
(45) Date of Patent: Jun. 24, 2025

(54) METHOD FOR OPERATING A PARTICLE BEAM MICROSCOPE, PARTICLE BEAM MICROSCOPE AND COMPUTER PROGRAM PRODUCT

(71) Applicant: Carl Zeiss Microscopy GmbH, Jena (DE)

(72) Inventors: Martin Ross-Messemer, Essingen (DE); Ivo Ihrke, Scheuerfeld (DE); Arian Kriesch, Aalen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 341 days.

(21) Appl. No.: 17/810,783

(22) Filed: Jul. 5, 2022

(65) Prior Publication Data

US 2023/0011964 A1 Jan. 12, 2023

(30) Foreign Application Priority Data

Jul. 7, 2021 (DE) .......................... 102021117592.5

(51) Int. Cl.
H01J 37/244 (2006.01)
(52) U.S. Cl.
CPC ..... *H01J 37/244* (2013.01); *H01J 2237/2445* (2013.01); *H01J 2237/24475* (2013.01)
(58) Field of Classification Search
CPC ............. H01J 37/244; H01J 2237/2445; H01J 2237/24475
See application file for complete search history.

(56) References Cited

U.S. PATENT DOCUMENTS

| 7,490,009 B2 | 2/2009 | Gottlieb et al. |
| 9,696,268 B2 | 7/2017 | Sinha et al. |

(Continued)

FOREIGN PATENT DOCUMENTS

| AU | 2012201146 B2 | 10/2012 |
| EP | 2 546 638 A2 | 1/2013 |

(Continued)

OTHER PUBLICATIONS

German Office Action, with translation thereof, for corresponding DE application No. 10 2021 117 592.5 dated Mar. 29, 2022.
(Continued)

*Primary Examiner* — Nicole M Ippolito
*Assistant Examiner* — Hanway Chang
(74) *Attorney, Agent, or Firm* — Fish & Richardson P.C.

(57) ABSTRACT

A method for operating a particle beam microscope comprises scanning an object using a particle beam and detecting electrons and x-ray radiation when scanning an object using a particle beam. Improved x-ray radiation information can be generated by combining weighted x-ray radiation information items according to the formula $$S_e(\vec{r}_i) = \sum_j w(i, j) \cdot S(\vec{r}_j),$$

wherein $S(\vec{r}_i)$ is the detected x-ray radiation intensity assigned to a location $\vec{r}_i$. The following holds true for the weights, for example:

$$w(i, j) = e^{-(\vec{r}_i - \vec{r}_j)^2/\sigma_f^2} \cdot e^{-(I(\vec{r}_i) - I(\vec{r}_j))^2/\sigma_g^2},$$

(Continued)

wherein $I(\vec{r})$ represents the intensity of the detected electrons that is assigned to the location $\vec{r}$, and $\sigma_f$ and $\sigma_g$ are constants.

20 Claims, 3 Drawing Sheets

(56) References Cited

U.S. PATENT DOCUMENTS

| 9,778,215 B2 | 10/2017 | Owen et al. |
|---|---|---|
| 2010/0034353 A1 | 2/2010 | Kravis et al. |
| 2011/0301869 A1 | 12/2011 | Gottlieb et al. |
| 2013/0054153 A1 | 2/2013 | Motl et al. |

FOREIGN PATENT DOCUMENTS

| EP | 2 284 524 B1 | 1/2014 |
|---|---|---|
| EP | 2 827 297 B1 | 11/2018 |
| WO | WO 2004/034044 A1 | 4/2004 |
| WO | WO 2014/181132 A1 | 11/2014 |
| WO | WO 2017/050303 A1 | 3/2017 |

OTHER PUBLICATIONS

J. Chen et al., "Real-time Edge-Aware Image Processing with the Bilateral Grid", ACM Transactions on Graphics 26, 1999, pp. 1-9.

C. Tomasi et al., "Bilateral Filtering for Gray and Color Images", Proceedings of the 1998 IEEE International Conference on Computer Vision, 1998, pp. 1-8.

Bennett, Eric P., John L. Mason, and Leonard McMillan. 2006. "Multispectral Video Fusion." In ACM SIGGRAPH 2006 Sketches on—SIGGRAPH '06, 16:123. New York, New York, USA: ACM Press.

Caraffa, Laurent, Jean-Philippe Tarel, and Pierre Charbonnier. 2015. "The Guided Bilateral Filter: When the Joint/Cross Bilateral Filter Becomes Robust." IEEE Transactions on Image Processing 24 (4): 1199-1208.

Eisemann, Elmar, and Fredo Durand. 2004. "Flash Photography Enhancement via Intrinsic Relighting." In ACM SIGGRAPH 2004 Papers on—SIGGRAPH '04, 673. New York, New York, USA: ACM Press.

Petschnigg, Georg, Maneesh Agrawala, Hugues Hoppe, Richard Szeliski, Michael Cohen, and Kentaro Toyama. 2004. "Digital Photography with Flash and No-Flash Image Pairs." ACM SIGGRAPH 2004 Papers, SIGGRAPH 2004 1 (212): 664-72.

Scientific, Thermo Fisher. 2020. "Thermo Fisher Scientific Product Catalog: Scanning Electron Microscopes.".

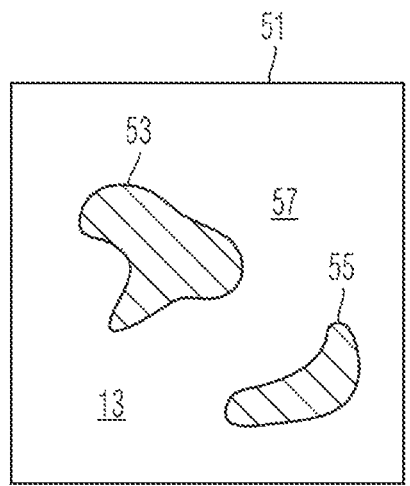 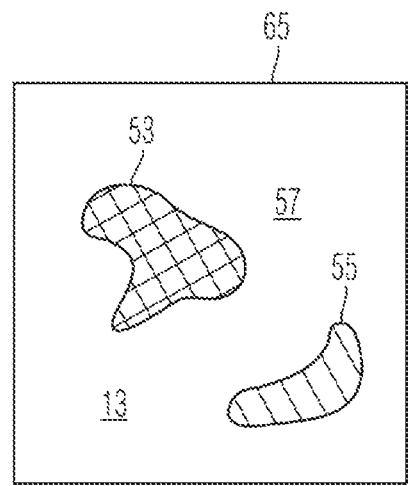
Fig. 3        Fig. 4
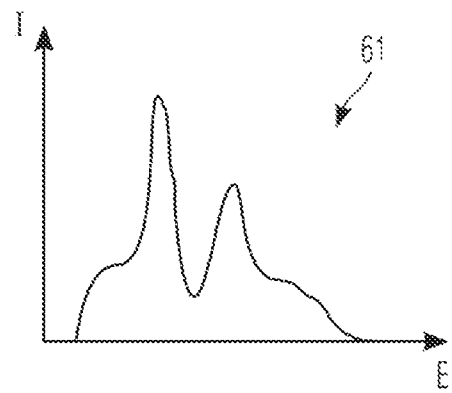 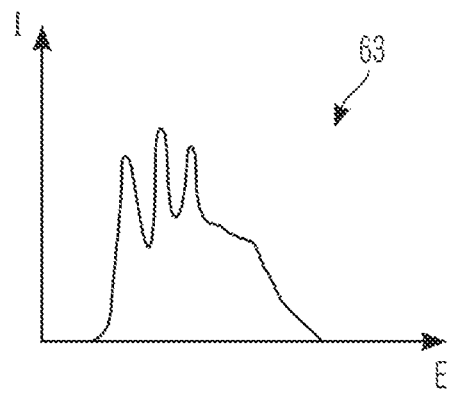
Fig. 5A        Fig. 5B

METHOD FOR OPERATING A PARTICLE BEAM MICROSCOPE, PARTICLE BEAM MICROSCOPE AND COMPUTER PROGRAM PRODUCT

CROSS-REFERENCE TO RELATED APPLICATION

This application claims benefit under 35 U.S.C. § 119 to German Application No. 10 2021 117 592.5, filed Jul. 7, 2021. The contents of this application is hereby incorporated by reference in its entirety.

FIELD

The disclosure relates to particle beam microscopes and methods for operating particle beam microscopes. For example, the disclosure relates to particle beam microscopes and methods for operating same which involve directing a particle beam onto an object and detecting electrons and x-ray radiation generated in the process. Furthermore, the disclosure relates to a computer program product which can be used for operating a particle beam microscope.

BACKGROUND

Particle beam microscopes which detect electrons and x-ray radiation generated by the incident particle beam are used in material analysis, for example, since various properties of materials of objects examined become visible in images generated on the basis of the detected electrons and images generated on the basis of the detected x-ray radiation. A conventional issue in the case of such examination methods can be that the detection of the x-ray radiation for the recording of an image generated on the basis of the detected x-ray radiation with a sufficient quality can involve significantly more time than may be involved for detecting electrons for the generation of an image generated on the basis of the detected electrons with a customary quality. This is owing to the fact, inter alia, that the number of x-ray quanta generated by the incident particle beam, and the probability of their being detected by customary detectors, are relatively low. Therefore, it can be difficult to obtain the x-ray radiation information concerning an examined object with sufficient statistics and an appropriately low proportion of noise in a satisfactorily short time. This can hold true, for example, if the x-ray radiation is detected in an energy-resolved manner and spectra of the x-ray radiation generated at the object are correspondingly recorded. Furthermore, even in the case of long measurements that result in sufficient statistics, the images generated on the basis of the detected x-ray radiation can have a significantly lower spatial resolution than the images obtained simultaneously on the basis of the detected electrons. This is owing to the fact that the spatial resolution can be limited by the volume at the object from which the detected radiation emerges after excitation by the focused particle beam incident on the object. The volume around the incidence location of the incident focused particle beam from which detected x-ray radiation emerges can be significantly larger than the volume around the incidence location from which detected electrons emerge.

In order to improve the quality of the detected x-ray radiation information with regard to statistical criteria, it is conventional practice to combine pieces of x-ray radiation information that are associated with a plurality of locations of an object or pixels of an image. By way of example, the pieces of x-ray radiation information associated with 4, 9 or 16 adjacent pixels are combined by addition. This can improve the statistical quality of the combined pieces of x-ray radiation information in comparison with the x-ray radiation information originally associated with individual pixels, but can result in a further impairment of the spatial resolution of a microscopic image generated on the basis of the combined x-ray radiation information items.

EP 2 546 638 A2 discloses a method in which the image generated on the basis of the detection of electrons is evaluated. Pixels having identical ranges of greyscale values in said image are combined into groups. The pieces of x-ray radiation information associated with the pixels of each group are then added in order to obtain pieces of x-ray radiation information with improved statistics for this group of pixels. This group of pixels can then be represented with an identical colour in an image, and mutually different groups of pixels can be represented with mutually different colours. The different colours of the resulting colour image can represent different materials in the object examined.

Summary

It has been found that in some situations certain known methods cannot differentiate between different materials with sufficient reliability.

The present disclosure seeks to provide a method for operating a particle beam microscope in which electrons and x-ray radiation are detected and particle-microscopic images that visualize different materials in an object can be generated on the basis of the detected electron radiation information items and x-ray radiation information items.

The disclosure proposes a method for operating a particle beam microscope which comprises directing a particle beam onto a multiplicity of locations of an object. In this case, the method can comprise, for each given location of the multiplicity of locations, detecting electrons generated by the particle beam directed onto the given location, and detecting x-ray radiation generated by the particle beam directed onto the given location.

In accordance with exemplary embodiments, plural pieces of electron beam information, each representing an intensity of the detected electrons, and plural pieces of x-ray radiation information, each representing an intensity of the detected x-ray radiation are stored. The storing can be performed, for example, such that images can be generated from the stored pieces of information, i.e. the pieces of electron radiation information and pieces of x-ray radiation information which can be associated with locations at the object or pixels in the respectively generated image, such that topological relationships within a two-dimensional object can be maintained and become visible in a two-dimensional image.

In accordance with exemplary embodiments, the stored location information represents the given location onto which the particle beam is directed. The stored electron radiation information represents an intensity of the electrons detected while the particle beam is directed onto the given location so that this intensity is associated with the location information. The stored x-ray radiation information represents an intensity of the x-ray radiation detected while the particle beam is directed onto the given location so that the intensity is associated with the location information.

In accordance with exemplary embodiments, the method comprises, for a plurality of, for example all, given locations of the multiplicity of locations, generating improved x-ray radiation information and storing the improved x-ray radiation information associated with the location information representing the given location. Pieces of improved x-ray radiation information can be represented as an image, for example, which can have improved properties and for example can visualize different materials in the object in different ways.

In accordance with exemplary embodiments, generating the improved x-ray radiation information for the given location comprises combining a plurality of weighted pieces of x-ray radiation information. The plurality of weighted pieces of x-ray radiation information can comprise the x-ray radiation information associated with the given location if x-ray radiation information is associated with the given location, and pieces of x-ray radiation information associated with locations that are different from the given location. Combining the plurality of pieces of weighted x-ray radiation information can comprise, for example, adding values of the plurality of pieces of x-ray radiation information taking into account the corresponding weights.

In accordance with exemplary embodiments, for the weights of the pieces of x-ray radiation information that are used when combining the plurality of pieces of weighted x-ray radiation information, it holds true that the weight decreases with the distance between the given location and the location represented by the location information associated with the weighted x-ray radiation information.

In accordance with further embodiments, for the weights of the pieces of x-ray radiation information that are used during combining, it holds true that the pieces of weight decreases with an absolute value of a difference between the intensity represented by the electron radiation information associated with the location information representing the given location, and the intensity represented by the electron radiation information associated with the location information associated with the weighted x-ray radiation information. Thus, the weight used for combining the plurality of pieces of weighted x-ray radiation information becomes all the larger, the smaller the distance between the locations whose x-ray radiation information items are combined, and the smaller the difference between the detected electron intensities associated with these locations. Conversely, the weights become all the smaller, the larger the distance between the locations whose x-ray radiation information items are combined, and the larger the difference between the detected electron intensities associated with these locations.

It is thus possible, for example, that regions of the object which are made of different materials and are at a distance from one another in the object and cause an identical detected electron intensity, i.e. have an identical greyscale value in the electron image, nevertheless appear differently in the image generated on the basis of the improved x-ray radiation information items, since the x-ray radiation information items associated with the individual regions can be combined separately according to regions. In this regard, not necessarily all pixels, for instance, of the two regions which are made of different materials are combined into a group because the regions appear with an identical greyscale value in the electron image. This could specifically result in the x-ray radiation information items of the two regions being jointly averaged and specific x-ray radiation information items concerning the individual regions therefore being lost.

In accordance with exemplary embodiments, a representation is generated from the improved pieces of x-ray radiation information associated with the multiplicity of locations, which representation can be represented on a screen or on paper, for example, and can be considered visually. In this case, for example, the improved pieces of x-ray radiation information associated with the multiplicity of locations can be classified into a plurality of groups, wherein pairs of pieces of x-ray radiation information associated with a same group are more similar to one another in accordance with a predetermined similarity criterion than pairs of pieces of x-ray radiation information associated with to different groups. The predetermined similarity criterion can comprise, for example, a mathematical formula which takes the x-ray radiation information as an argument, wherein the evaluation of the formula results in a value.

The predetermined similarity criterion can then furthermore comprise a comparison operation which takes two such values as argument and returns a value indicating the similarity between two x-ray radiation information. If the x-ray radiation information associated with a location is represented by a numerical value, the classification into groups can be performed, for example, on the basis of a plurality of predetermined value ranges of the value. If the x-ray radiation information associated with a location is an x-ray spectrum, for example, the determination of the similarity criterion can involve a comparison between pairs of x-ray spectra associated with different locations. For this purpose, it is possible, for example, to first normalize the two spectra and then to determine a sum of squares of distances for different energies in order to obtain a value representing the similarity between two spectra. The classification of the pieces of x-ray radiation information into the plurality of groups can then be achieved, for example, via a clustering method, such as K-means, for example.

In a representation of the pieces of x-ray radiation information, those which are assigned to the same group are each represented with the same representation feature, and those which are assigned to different groups are represented with different representation features. The representation features can comprise a colour, a brightness and/or a colour saturation, for example.

In accordance with exemplary embodiments, detecting the x-ray radiation comprises reading an energy-dispersive x-ray detector. In accordance with further exemplary embodiments, detecting the electrons comprises reading an electron detector, which can be for example a backscattered electron detector.

In accordance with exemplary embodiments, combining the plurality of weighted pieces of x-ray radiation information comprises adding weighted intensity values of detected x-ray radiation intensities. In this case, the intensity values can be integrated values, i.e. values which originate from outputs of the x-ray radiation detector and which were integrated energy-independently over a given sampling period. Furthermore, the added intensity values can originate from outputs of the x-ray detector which were detected in a specific energy interval over a specific time duration. For example, the detector can be able to detect the energy of incident x-ray quanta and to output detection signals representing the detected energy of the respectively detected x-ray quantum.

The disclosure furthermore provides a particle beam microscope comprising a particle source for generating a particle beam, an electron detector, an x-ray radiation detector and a controller. In this case, the controller is configured to process instructions which cause the particle beam microscope to carry out the method disclosed here.

The disclosure furthermore provides a computer program product comprising computer-readable instructions which, when they are executed by a controller of a particle beam system, cause the particle beam system to carry out the method disclosed here.

BRIEF DESCRIPTION OF THE DRAWINGS

Embodiments of the disclosure are explained in greater detail below with reference to figures, in which:

FIG. 3 shows a schematic illustration of an image generated on the basis of electron radiation information obtained from an object via the particle beam microscope from FIG. 1;

FIG. 4 shows a schematic illustration of an image generated on the basis of improved x-ray radiation information obtained from the object from FIG. 3 via the particle beam microscope from FIG. 1; and FIG. 5A and FIG. 5B show exemplary x-ray radiation information associated with different regions of the images in FIGS. 3 and 4.

DETAILED DESCRIPTION

Figure 1:
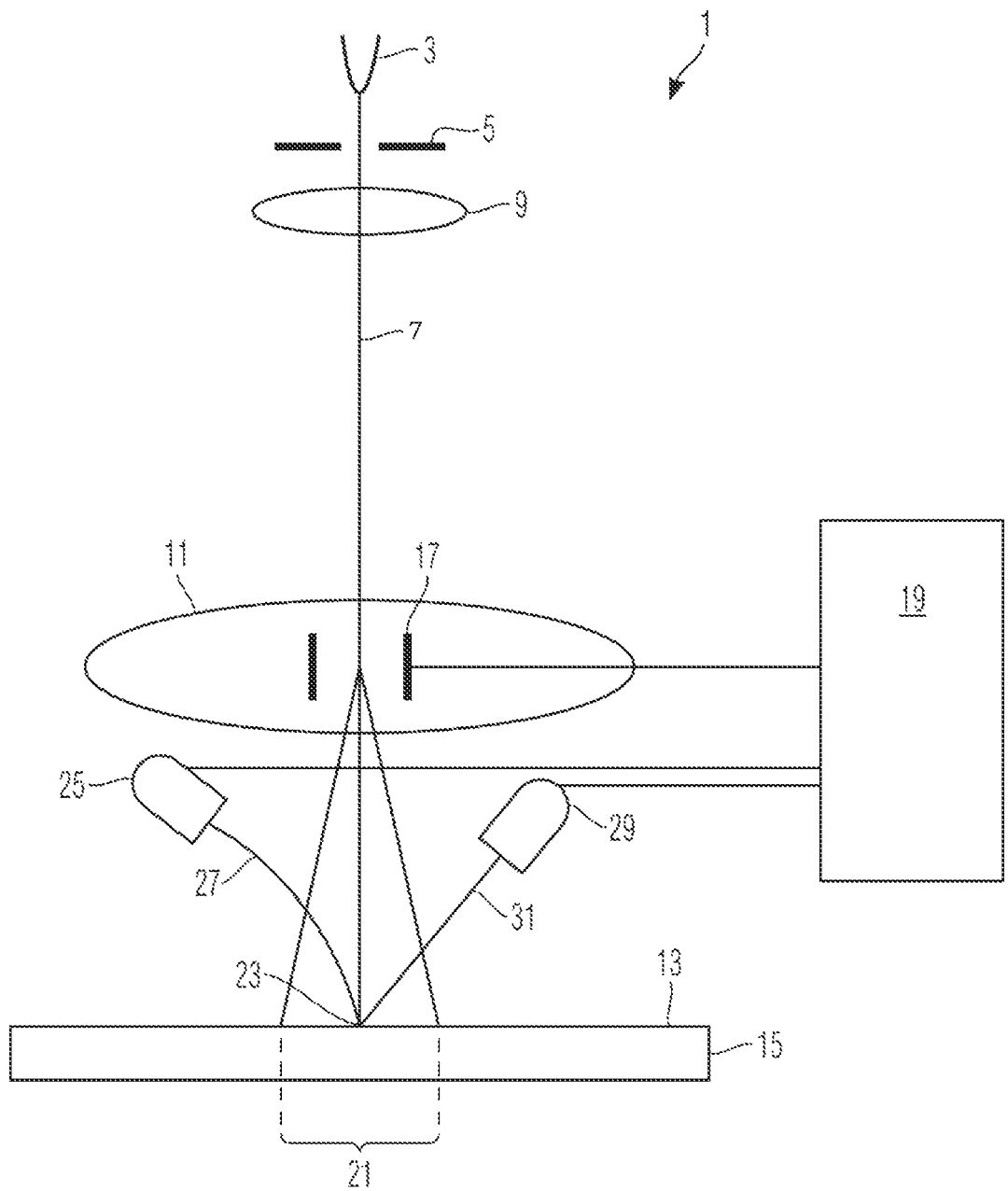
FIG. 1 shows a schematic illustration of a particle beam microscope in accordance with one embodiment.

FIG. 1 is a schematic illustration of a particle beam microscope 1. The particle beam microscope 1 comprises a particle source 3, which emits particles that are accelerated towards an electrode 5 in order to generate a beam 7 of particles. The particles can be electrons or ions. The particle beam 7 can be collimated by a collimation lens 9. The particle beam 7 passes through an objective lens 11 in order to be focused at a surface 13 of an object 15. A beam deflector 17 is controlled by a controller 19, comprising a computer, in order to deflect the particle beam 7 in such a way that the particle beam is incident on the surface 13 of the object 15 at a desired adjustable location 23 within a two-dimensional region 21.

The particle beam 7 incident on a given location 23 at the surface 13 of the object 15 generates interaction products on account of the interaction of the particles of the particle beam 7 with the material of the object 15 at the location 23, said interaction products being detectable. The particle beam microscope comprises a backscattered electron detector 25 for detecting backscattered electrons. An exemplary trajectory of a backscattered electron is provided with the reference sign 27 in FIG. 1. The particle beam microscope furthermore comprises an x-ray detector 29 for detecting x-ray quanta. An exemplary trajectory of an x-ray quantum is provided with the reference sign 31 in FIG. 1.

Figure 2:
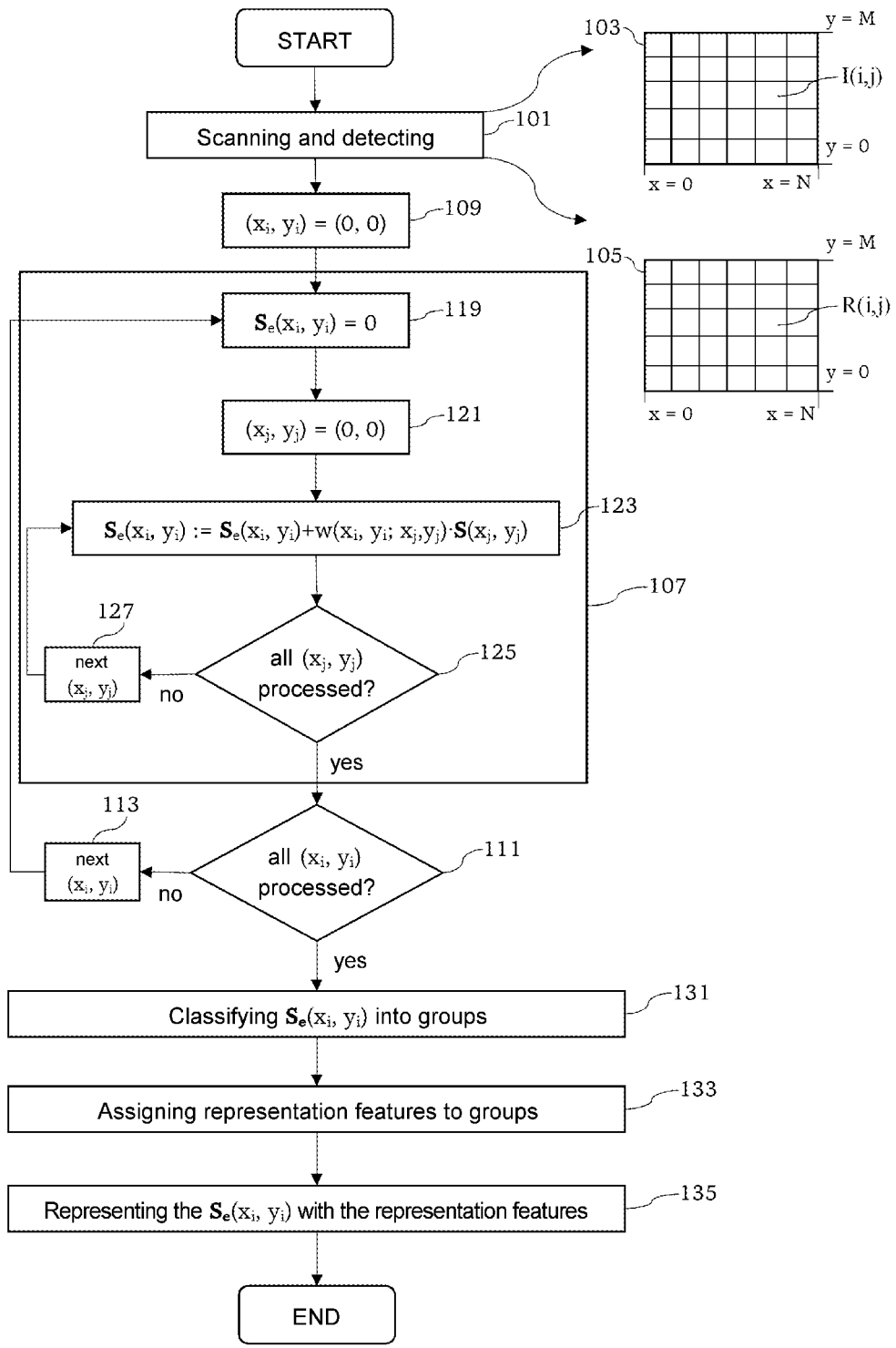
FIG. 2 shows a flow diagram for elucidating a method for operating the particle beam microscope from FIG. 1 in accordance with one embodiment.

One example of a method for operating the particle beam microscope 1 is explained below with reference to the flow diagram in FIG. 2.

Firstly, the object 15 is positioned relative to the particle beam microscope 1 in such a way that the particle beam microscope 1 can scan a region 21 of interest at the surface 13 of the object 15 using the particle beam 7. Then, in a step 101, the region 21 of the surface 13 of the object 15 is scanned systematically via the particle beam 7. This means that the particle beam 7 is scanned line by line over the surface 13. In this case, as a result of the actuation of the beam deflector 17, the incidence location 23 of the beam 7 at the surface is displaced to a next location within the line and left there for a predetermined time ("dwell time"). During this time the detectors 25 and 29 collect electron radiation information and x-ray radiation information, respectively, which is read in by the controller 19 and stored in associated with the location 23 onto which the particle beam 7 is directed. The storing can be achieved, for example, by using the data structure of a two-dimensional array, as is illustrated by way of example in FIG. 2 with an array 103 for the pieces of electron radiation information and an array 105 for the pieces of x-ray radiation information. The storage contents of the data structures 103 and 105 can each be addressed by way of two indices x and y, the values of which are between 0 and N, and 0 and M, respectively. The individual storage contents of the data structure 103 of the electron beam radiation information can each be for example a numerical value representing the number of electrons which were detected by the detector 25 during the predetermined time duration. The individual storage contents of the data structure 105 of the x-ray radiation information can each be for example an energy spectrum representing the x-ray spectrum which was detected by the detector 29 during the predetermined time duration. Each x-ray spectrum can be represented by a number of numerical values each representing the number of x-ray quanta which were detected in a specific energy interval.

A pair of the indices $(x_i, y_i)$ thus indicates the location information $\vec{r}_i$ representing the i-th location 23 at the surface 13 of the object 15 onto which the particle beam 7 was directed during the process of obtaining the electron beam information assigned to this location and the x-ray radiation information assigned to this location. The storing of the information in the data structure of the two-dimensional arrays 103 and 105 is just one example, however, and other data structures can be used in order to store the pieces of location information $\vec{r}_i$ and the electron beam information and x-ray radiation information associated with said pieces of location information.

The contents of the data structures 103 and 105 can be represented as images on a representation medium, such as a screen or paper, for instance, by representation features, such as brightness, colour or colour saturation, for instance, being assigned to the contents, i.e. the individual pieces of electron radiation information and pieces of x-ray radiation information, and these representation features being used in the generation of the representation.

The situation in practice is such that the values stored in the individual elements of the data structure 105 for the x-ray radiation information may have a comparatively large amount of noise and small signal in comparison with those in the elements of the data structure 103 for the electron radiation information, on account of deficient statistics. Therefore, after the scanning of the surface 13 of the object 15 in step 101, the x-ray radiation information items of the data structure 105 are improved.

For this purpose, a processing 107 including a plurality of steps is carried out for each location $(x_i, y_i)$. Therefore, a given location $(x_i, y_i)$ is set to the value (0, 0) in a step 109, the processing 107 is executed for this given location, and then a step 111 involves querying whether all the given locations $(x_i, y_i)$ have been processed. If this is not the case, the given location $(x_i, y_i)$ is set to a next location in a step 113, and the processing 107 and also the query 111 are executed again.

The processing 107 comprises a step 119, in which the improved x-ray radiation information $S_e$ associated with the given location $(x_i, y_i)$ is set to zero.

A calculation in which all locations (x,y) are taken into consideration is then carried out for the given location $(x_i, y_i)$. For this purpose, a considered location $(x_j, y_j)$ is set to the value (0, 0) in a step 121, a processing is executed for this considered location in a step 123, and then a step 125 involves querying whether all the considered locations ($x_j$, $y_j$) have been processed. If this is not the case, the considered location ($x_j,y_j$) is set to a next location in a step 127, and step 123 and also the query 125 are executed again.

In step 123, the x-ray radiation information associated with the considered location ($x_i,y_i$) is weighted with the weight w(i,j) and added to the improved x-ray radiation information associated with the given location ($x_i,y_i$). The processing 107 thus realizes a calculation in accordance with the following equation:

$$S_e(\vec{r}_i) = \sum_j w(i,j) \cdot S(\vec{r}_j) \tag{1}$$

The weight w used here depends on the two locations, that is to say the given location ($x_i,y_i$) and the considered location ($x_j,y_j$). The weight decreases with the distance between the given location ($x_i,y_i$) and the considered location ($x_j,y_j$). The weight furthermore decreases with the absolute value of the difference between the intensity represented by the electron radiation information associated with the given location ($x_i,y_i$) and the intensity represented by the electron radiation information associated with the considered location ($x_j,y_j$).

For example, the weight can be calculated as a product of two terms, of which one is dependent on the distance between the given location ($x_i,y_i$) and the considered location ($x_j,y_j$) and the other is dependent on the difference between the electron radiation intensity at the given location ($x_i,y_i$) and the electron radiation intensity at the considered location ($x_j,y_j$).

By way of example, the weight can be calculated according to the formula:

$$w(i,j)=w(\vec{r}_i,\vec{r}_j)=f(|\vec{r}_i-\vec{r}_j|)\cdot g(|I(\vec{r}_i)-I(\vec{r}_j)|) \tag{2}$$

wherein $\vec{r}$ represents the location (x,y), $I(\vec{r})$ represents the intensity of the detected electrons that is assigned to the location (x,y), $f(|\vec{r}_i-\vec{r}_j|)$ is a function which decreases with the distance between the given location $\vec{r}_i$ and the considered location $\vec{r}_j$, and $g(|I(\vec{r}_i)-I(\vec{r}_j)|)$ is a function which decreases with the absolute value of the difference between the intensities of the detected electrons.

The function f can be represented by the following formula, for example:

$$f(|\vec{r}_i-\vec{r}_j|) = \frac{1}{C_f} e^{-(\vec{r}_i-\vec{r}_j)^2/\sigma_f^2} \tag{3}$$

wherein $\sigma_f$ and $C_f$ are parameters that can be chosen in a suitable manner.

The function g can be represented by the following formula, for example:

$$g(|I(\vec{r}_i)-I(\vec{r}_j)|) = \frac{1}{C_g} e^{-(I(\vec{r}_i)-I(\vec{r}_j))^2/\sigma_g^2} \tag{4}$$

wherein $\sigma_g$ and $C_g$ are parameters that can be chosen in a suitable manner.

If it is found in step 125 that all locations have been used as considered locations ($x_j,y_j$) in step 123, the processing is continued at step 111.

If it is found in step 111 that all locations have been used as given locations ($x_i,y_i$) in the processing 107, the improved x-ray radiation information items $S_e(\vec{r})$ are classified into groups in a step 131. In a step 133, different representation features are assigned to each of the plurality of groups. In a step 135, the x-ray radiation information items are then represented on a representation medium using the representation features.

FIG. 3 shows a schematic illustration of an image 51 which was generated on the basis of the contents of the storage structure 103, i.e. the electron radiation information items obtained from an object 15 via the particle beam microscope 1. FIG. 3 thus shows an image 51 of the surface 13 of the object 15, in which two smaller regions 53 and 55 are discernible, which are spaced apart from one another and embedded in a larger region 57.

The regions 53 and 55 have identical greyscale values in the image 51, while the greyscale value of the region 57 surrounding the regions 53 and 55 is different therefrom. On the basis of the analysis of the image 51 of the electron radiation information, it can be deduced that the material in the regions 53 and 55 is different from the material in the region 57. However, it cannot necessarily be deduced that the material in the region 55 is identical to the material in the region 53, since it is possible for different materials to result in identical greyscale values in the electron beam image.

This last is the case in the example explained here. FIG. 5A shows an exemplary x-ray spectrum 61 obtained by combining the x-ray spectra associated with the locations within the region 53 of the image 51. FIG. 5B shows an exemplary x-ray spectrum 63 obtained by combining the x-ray spectra associated with the locations within the region 55 of the image 51. It is evident that the x-ray spectra 61 and 63 in FIG. 5A and FIG. 5B, respectively, differ significantly from one another, for which reason it can be deduced that the regions 53 and 55 are formed by different materials.

FIG. 4 shows a schematic illustration of an image 65 which was generated on the basis of the improved pieces of x-ray radiation information $S_e(\vec{r})$ obtained on the basis of the electron radiation information and the x-ray radiation information obtained from an object 15 using the particle beam microscope 1. In FIG. 4, the regions 53, 55 and 57 are represented by representation features that are pairwise distinct from one another, such as brightness or colour, for instance, such that the observer of the image can directly perceive that the regions 53 and 55 differ from one another with regard to their material.

The implementation of the method explained with reference to FIG. 2 reveals that the improved pieces of x-ray radiation information $S_e(\vec{r})$ for the regions 53 and 55 differ from one another. This is owing to the fact that a plurality of weighted pieces of x-ray radiation information are combined in order to determine the improved pieces of x-ray radiation information $S_e(\vec{r})$, wherein the weights used are decreasing with the distance between the considered locations. Therefore, in the determination of the improved pieces of x-ray radiation information $S_e(\vec{r})$ for example within the region 55 pieces of x-ray radiation information from the region 55 contribute to a greater extent than pieces of x-ray radiation information from the region 53 arranged at a distance from the region 55. Accordingly, in the determination of the improved pieces of x-ray radiation information, the locations in the two different regions 53 and 55 are not treated identically on account of their corresponding electron radiation information, i.e. corresponding greyscale values, which would make them indistinguishable to the observer's eye in the image generated from the improved x-ray radiation information. According to the method described here, regions which are arranged at a distance from one another and which are very similar on the basis of the electron radiation information associated with them can be detected and correspondingly also represented as regions that are indeed different with regard to the material forming the regions.

Herein, the method can be adapted to specific situation occurring in practice by the setting of parameters. One of these parameters is the parameter $\sigma_f$ in formula (3) above, which can be considered as a lateral filter width, which sets how the contribution of x-ray radiation information at a considered location $(x_j, y_j)$ to the improved x-ray radiation information at the given location $(x_j, y_j)$ decreases with the distance between the considered location and the given location. The parameter $C_f$ in formula (3) above can be considered as a normalization parameter and be set accordingly. The parameters can be chosen suitably for example for each object examined. By way of example, the user can set the value of the parameter $\sigma_f$ and change it until the user approves of the resulting image of the improved x-ray radiation information after consideration. It is also conceivable for the values of the parameters $\sigma_f$ and $C_f$ to be set in an automated manner, specifically for example on the basis of an analysis of the electron radiation information, the x-ray radiation information and/or the improved x-ray radiation information with regard to, for example, contrast, image noise, characteristic variables of image constituents and the like. A similar procedure can be adopted with the parameters $\sigma_g$ and $C_f$ in formula (4). If formulae other than formulae (1) to (4) mentioned in association with the embodiment explained with reference to FIG. 2 are used in the method, then such other methods also contain parameters which are correspondingly settable, thus establishing a result which is suitable for the user.

The method explained above can be carried out by the controller 19 of the particle beam microscope 1. For this purpose, the controller 19 has the functions of a computer in order to execute the desired image processing. These functions are provided by hardware having components which comprise one or more processors, main memory for the processor, storage media for programs and data and communication interfaces. These components can be arranged close to the particle-optical components such as the particle source 3 and the objective lens 11, but they can also, in part or in their entirety, be arranged remotely therefrom and, in this case, can be connected for example via a remote data connection, such as the Internet, for instance, to a part of the controller 19, which is arranged close to particle-optical components in order to control the latter. The method is carried out by the controller, for example, by virtue of the latter accessing a computer program product comprising computer-readable instructions. These instructions implement the method as a program which comprises instructions for processors of the controller 19, is loaded from a storage medium into the main memory of the processors and is processed by the processors. Using the program, the location information items and the electron radiation information items and x-ray radiation information items assigned to the locations are likewise loaded into the main memory and analysed as described above in order that the improved x-ray radiation information items are generated, stored in storage media and optionally represented on a display medium.

What is claimed is:

1. A method of operating a particle beam microscope, the method comprising:
   directing a particle beam onto a multiplicity of locations of an object;
   for each given location of the multiplicity of locations:
      storing location information representing the given location onto which the particle beam is directed;
      detecting electrons generated by the particle beam directed onto the given location;
      storing electron radiation information representing an intensity of the detected electrons in association with the location information;
      detecting x-ray radiation generated by the particle beam directed onto the given location; and
      storing x-ray radiation information representing an intensity of the detected x-ray radiation in association with the location information; and
   for a plurality of given locations of the multiplicity of locations:
      generating improved x-ray radiation information; and
      storing the improved x-ray radiation information in association with the location information representing the given location,
      wherein generating the improved x-ray radiation information comprises combining a plurality of weighted pieces of x-ray radiation information, and
   wherein the following holds true for each weight of weights of the x-ray radiation information used in the combining:
      the weight decreases with increasing distance between the given location and a location represented by the location information associated with the weighted x-ray radiation information; and
      the weight decreases with increasing absolute value of a difference between the intensity represented by the electron radiation information associated with the location information representing the given location and the intensity represented by the electron radiation information associated with the location information which is also associated with the weighted x-ray radiation information.

2. The method of claim 1, further comprising generating a representation of the improved pieces of x-ray radiation information associated with the multiplicity of locations.

3. The method of claim 2, further comprising classifying the improved pieces of x-ray radiation information associated with the multiplicity of locations into a plurality of groups,
   wherein:
      pairs of pieces of x-ray radiation information associated with a same group are more similar to one another in accordance with a predetermined similarity criterion than pairs of pieces of x-ray radiation information assigned to different groups;
      pieces of x-ray radiation information associated with a same group are each represented, in the same representation, with a same representation feature; and
      pieces of x-ray radiation information associated with different groups are represented, in the representation, with different representation features.

4. The method of claim 3, wherein the representation features comprise a brightness, a colour and/or a colour saturation.

5. The method of claim 1, wherein the x-ray radiation information associated with the location information represents an energy spectrum.

6. The method of claim 5, wherein detecting the x-ray radiation comprises reading an energy-dispersive x-ray detector.

7. The method of claim 1, wherein detecting the electrons comprises reading an electron detector.

8. The method of claim 7, wherein the electron detector is a backscattered electron detector.

9. The method of claim 1, wherein combining the plurality of weighted pieces of x-ray radiation information comprises adding weighted intensity values of detected x-ray radiation intensities.

10. The method of claim 1, wherein:
the improved x-ray radiation information is determined according to the following equation:

$$S_e(\vec{r}_i) = \sum_j w(i,j) \cdot S(\vec{r}_j);$$

$S_e(\vec{r}_i)$ represents the improved x-ray radiation intensity associated with a given location $\vec{r}_i$;

$S(\vec{r}_j)$ represents the x-ray radiation intensity associated with a location $\vec{r}_j$; and $w(i,j)$ represents the weight.

11. The method of claim 10, wherein:

$$w(i,j) = f(|\vec{r}_i - \vec{r}_j|) \cdot g(|I(\vec{r}_i) - I(\vec{r}_j)|);$$

$I(\vec{r})$ represents the intensity of the detected electrons associated with the location $\vec{r}$;

$f(|\vec{r}_i - \vec{r}_j|)$ is a function which decreases with increasing distance between the locations $\vec{r}_i$ and $\vec{r}_j$; and $g(|I(\vec{r}_i) - I(\vec{r}_j)|)$ is a function which decreases with increasing absolute value of the difference between intensities of detected electrons.

12. The method of claim 11, wherein $$f(|\vec{r}_i - \vec{r}_j|) = \frac{1}{C_f} e^{-(\vec{r}_i - \vec{r}_j)^2 / \sigma_f^2},$$

and wherein $C_f$ and $\sigma_f$ are parameters.

13. The method of claim 12, wherein $$g(|I(\vec{r}_i) - I(\vec{r}_j)|) = \frac{1}{C_g} e^{-(I(\vec{r}_i) - I(\vec{r}_j))^2 / \sigma_g^2},$$

and wherein $C_g$ and $\sigma_g$ are parameters.

14. The method of claim 13, further comprising generating a representation of the improved pieces of x-ray radiation information associated with the multiplicity of locations.

15. The method of claim 14, further comprising classifying the improved pieces of x-ray radiation information associated with the multiplicity of locations into a plurality of groups,
wherein:
pairs of pieces of x-ray radiation information associated with a same group are more similar to one another in accordance with a predetermined similarity criterion than pairs of pieces of x-ray radiation information associated with different groups;
pieces of x-ray radiation information associated with a same group are each represented, in the representation, with a same representation feature; and
pieces of x-ray radiation information associated with different groups are represented, in the representation, with different representation features.

16. The method of claim 15, wherein the representation features comprise a brightness, a colour and/or a colour saturation.

17. The method of claim 11, wherein $$g(|I(\vec{r}_i) - I(\vec{r}_j)|) = \frac{1}{C_g} e^{-(I(\vec{r}_i) - I(\vec{r}_j))^2 / \sigma_g^2},$$

and $C_g$ and wherein $\sigma_g$ are parameters.

18. One or more machine-readable hardware storage devices comprising instructions that are executable by one or more processing devices to perform operations comprising the method of claim 1.

19. A system comprising:
one or more processing devices; and
one or more machine-readable hardware storage devices comprising instructions that are executable by the one or more processing devices to perform operations comprising the method of claim 1.

20. The system of claim 19, further comprising:
a particle source configured to generate a particle beam;
an electron detector; and
an x-ray radiation detector.

* * * * *

UNITED STATES PATENT AND TRADEMARK OFFICE
CERTIFICATE OF CORRECTION

| | | |
|---|---|---|
| PATENT NO. | : 12,340,972 B2 | Page 1 of 2 |
| APPLICATION NO. | : 17/810783 | |
| DATED | : June 24, 2025 | |
| INVENTOR(S) | : Martin Ross-Messemer, Ivo Ihrke and Arian Kriesch | |

It is certified that error appears in the above-identified patent and that said Letters Patent is hereby corrected as shown below:

In the Specification

Column 3, Lines 35-45, delete "Thus, the weight used for combining the plurality of pieces of weighted x-ray radiation information becomes all the larger, the smaller the distance between the locations whose x-ray radiation information items are combined, and the smaller the difference between the detected electron intensities associated with these locations. Conversely, the weights become all the smaller, the larger the distance between the locations whose x-ray radiation information items are combined, and the larger the difference between the detected electron intensities associated with these locations." and insert the same on Column 3, Line 36, as a new paragraph.

Column 4, Line 13, delete "argument" and insert -- arguments --.

Column 4, Line 14, after "two" insert -- pieces of --.

Column 5, Line 18, after "exemplary" insert -- pieces of --.

Column 5, Line 66, delete "associated" and insert -- association --.

Column 8, Lines 22-31, delete "The regions 53 and 55 have identical greyscale values in the image 51, while the greyscale value of the region 57 surrounding the regions 53 and 55 is different therefrom. On the basis of the analysis of the image 51 of the electron radiation information, it can be deduced that the material in the regions 53 and 55 is different from the material in the region 57. However, it cannot necessarily be deduced that the material in the region 55 is identical to the material in the region 53, since it is possible for different materials to result in identical greyscale values in the electron beam image." and insert the same on Column 8, Line 21 (Approx.), as a continuation of the same paragraph.

Column 9, Line 21, delete "$(x_j,y_j)$" and insert -- $(x_i,y_i)$ --.

In the Claims

Signed and Sealed this
Twenty-sixth Day of August, 2025

Coke Morgan Stewart
*Acting Director of the United States Patent and Trademark Office*

Column 12, Line 37, Claim 17, delete "$C_g$ and wherein" and insert -- wherein $C_g$ and --.